United States Patent
Mann

(10) Patent No.: US 8,817,233 B2
(45) Date of Patent: Aug. 26, 2014

(54) ILLUMINATION OPTICAL SYSTEM FOR PROJECTION LITHOGRAPHY

(75) Inventor: Hans-Juergen Mann, Oberkochen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 233 days.

(21) Appl. No.: 13/040,765

(22) Filed: Mar. 4, 2011

(65) Prior Publication Data

US 2011/0228244 A1    Sep. 22, 2011

Related U.S. Application Data

(60) Provisional application No. 61/332,295, filed on May 7, 2010.

(30) Foreign Application Priority Data

Mar. 17, 2010   (DE) .......................... 10 2010 002 982

(51) Int. Cl.
   *G03B 27/54*    (2006.01)
   *G03F 7/20*    (2006.01)

(52) U.S. Cl.
   CPC ........ *G03F 7/70075* (2013.01); *G03F 7/70091* (2013.01); *G03F 7/702* (2013.01)
   USPC ............... 355/67; 355/53; 359/855; 359/865; 378/34

(58) Field of Classification Search
   CPC .. G03F 7/70091; G03F 7/702; G03F 7/70075
   USPC ................. 355/53, 67; 378/34; 359/855, 865
   See application file for complete search history.

(56) References Cited

U.S. PATENT DOCUMENTS 5,677,939 A * 10/1997 Oshino ........................... 378/34
5,850,309 A * 12/1998 Shirai et al. ................... 359/360
(Continued)

FOREIGN PATENT DOCUMENTS

DE           101 55 711 A1    5/2003
DE      10 2009 009 568        4/2010
(Continued)

OTHER PUBLICATIONS

German Examination Report, with translation, for corresponding Application No. DE 10 2010 002 982.3, dated Nov. 18, 2010.

(Continued)

*Primary Examiner* — Steven H Whitesell Gordon
(74) *Attorney, Agent, or Firm* — Fish & Richardson P.C.

(57) ABSTRACT

An illumination optical system for projection lithography for the illumination of an illumination field has a facet mirror. An optical system, which follows the illumination optical system, has an object field which can be arranged in the illumination field of the illuminate optical system. The facet mirror has a plurality of facets to reflectively guide part bundles of a bundle of illumination light. Reflection faces of the facets are tiltable in each case. In a first illumination tilt position, the tiltable facets guide the part bundle impinging on them along a first object field illumination channel to the illumination field. In a different illumination tilt position, the tiltable facets guide the part bundle impinging on them along a different object field illumination channel to the illumination field. The reflection faces of the tiltable facets are configured so that the part bundle in the at least two illumination tilt positions is reflected with a degree of reflection R coinciding within a tolerance range of +/−10%. The result is an illumination optical system which avoids an undesired influence of the illumination tilt position of the tiltable facets on the illumination light throughput of the illumination optical system.

25 Claims, 11 Drawing Sheets

(56) References Cited

U.S. PATENT DOCUMENTS

| | | | |
|---|---|---|---|
| 5,973,826 A * | 10/1999 | Chapman et al. | 359/355 |
| 6,198,793 B1 * | 3/2001 | Schultz et al. | 378/34 |
| 6,438,199 B1 * | 8/2002 | Schultz et al. | 378/34 |
| 6,658,084 B2 | 12/2003 | Singer | |
| 6,859,328 B2 * | 2/2005 | Schultz et al. | 359/633 |
| 6,859,515 B2 | 2/2005 | Schultz | |
| 7,006,595 B2 * | 2/2006 | Singer et al. | 378/34 |
| 7,015,489 B2 | 3/2006 | Singer et al. | |
| 7,196,841 B2 | 3/2007 | Melzer et al. | |
| 7,405,809 B2 * | 7/2008 | Hainz et al. | 355/67 |
| 8,587,767 B2 * | 11/2013 | Fiolka et al. | 355/71 |
| 2002/0136351 A1 * | 9/2002 | Singer | 378/34 |
| 2004/0253426 A1 * | 12/2004 | Yakshin et al. | 428/212 |
| 2005/0002090 A1 * | 1/2005 | Singer et al. | 359/366 |
| 2005/0213198 A1 | 9/2005 | Lee et al. | |
| 2006/0192147 A1 * | 8/2006 | Kandaka et al. | 250/492.1 |
| 2009/0041182 A1 * | 2/2009 | Endres et al. | 378/34 |

FOREIGN PATENT DOCUMENTS

| | | |
|---|---|---|
| DE | 10 2009 017 095 | 10/2010 |
| EP | 1 225 481 | 7/2002 |
| WO | WO 2009/132756 A1 | 11/2009 |
| WO | WO 2010/118928 | 10/2010 |

OTHER PUBLICATIONS

Chinese Office Action, with translation thereof, for corresponding CN Appl No. 201110064478.7, dated Feb. 7, 2014.

\* cited by examiner

ILLUMINATION OPTICAL SYSTEM FOR PROJECTION LITHOGRAPHY

CROSS-REFERENCE TO RELATED APPLICATIONS

This application claims priority under 35 U.S.C. §119 to German Application No. 10 2010 002 982.3, filed Mar. 17, 2010, and also under 35 U.S.C. §119(e)(1) to U.S. Provisional Application No. 61/332,295 filed May 7, 2010. The contents of both of these applications are hereby incorporated by reference in its entirety.

FIELD

The disclosure relates to an illumination optical system for projection lithography for illuminating an illumination field. An imaging optical system, which follows the illumination optical system, has an object field which can be arranged in the illumination field of the illumination optical system. Furthermore, the disclosure relates to a method for assigning at least two second facets of a second facet mirror to illumination tilt positions of one of the first facets of a first facet mirror of such an illumination optical system, as well as an illumination system with such an illumination optical system, a projection exposure system with such an illumination system, a production method for microstructured or nanostructured components using such a projection exposure system, and a microstructured or nanostructured component produced by such a production method.

BACKGROUND

Illumination optical systems with facets which can be displaced between various illumination tilt positions, namely displaceable field facets, are known from U.S. Pat. No. 6,658,084 B2 and U.S. Pat. No. 7,196,841 B2.

SUMMARY

The disclosure provides an illumination optical system that avoids an undesired influence of illumination tilt position of the tiltable facets on the illumination light throughput of the illumination optical system, in particular on a total transmission of the illumination optical system.

It was recognised according to the disclosure that a degree of reflection coinciding within a tolerance range for the angles of incidence of the various illumination tilt positions leads to the fact that the tiltable field facets relay the illumination light impinging on them, regardless of their illumination tilt position, with energy coinciding in accordance with the coincidence of the degree of reflection within a predetermined tolerance range to the illumination field. Assuming a reflectivity that is independent of the respective illumination tilt position of the tiltable facets, of optical components perhaps following these facets, this leads to an energetic illumination of the illumination field that is independent of the illumination tilt position within the tolerance range. The part bundle can be reflected in the at least two illumination tilt positions with a degree of reflection coinciding within a tolerance range of +/−5%, of +/−2%, of +/−1% or with a degree of reflection coinciding still better. Generally, a plurality of facets of the facet mirror are tiltable between at least two illumination tilt positions. For example, one predetermined facet group, or else all the facets of the facet mirror, may be tiltable. The tiltable facets may be tiltable between precisely two illumination tilt positions. Alternatively, the tiltable facets may also be tiltable between more than two, for example between three or even more illumination tilt positions.

Angles of incidence coinciding within a tolerance range can lead to the possibility of configuring the tiltable facets and in particular a reflective coating on their reflection faces in an optimised manner for this coinciding angle of incidence. No optimisation is then involved for other angles of incidence.

A mirror symmetry can lead to a simply structured structure of the illumination optical system. The two object field illumination channels can pass into one another by reflection about a plane which contains the incident part bundle on the reflection face and is located perpendicular to an incidence plane of the part bundle.

Reflective portions can allow the same degrees of reflection for angles of incidence that are very different in the various illumination tilt positions. In principle, the reflection face may also be divided into more than two reflective portions, which can then in turn be assigned in accordance with the illumination tilt positions.

A reflection coating can allow a particularly high degree of reflection of the facets. The reflection coating can be configured as a single-layer coating. The reflection coating may be configured as a two-layer coating. The reflection coating can be configured as a multilayer coating. The multilayer coating may, for example, have five layers, ten layers, twenty layers, thirty layers or still more layers. The multilayer coating may be configured as a coating of alternate material layers. For example, alternating molybdenum/silicon layers may be used.

A design of the reflection coating may take place such that the facet provided with the reflection coating has the same degrees of reflection for different angles of incidence that are assigned to the various illumination tilt positions, and in particular for very differing angles of incidence. The reflection coating may also be designed such that the coincidence of the degree of reflection is present for more than two illumination tilt positions.

A broadband reflection coating can allow a constant degree of reflection within a range of angles of incidence around a specified value.

A design of the reflection coating can allow for two specific angles of incidence around the angle of incidence with the maximum degree of reflection with the same degree of reflection within a tolerance range. The degree of reflection coinciding within the tolerance range in the at least two illumination tilt positions may be more than 2% smaller (may be more than 5% smaller, or may be more than 10% smaller) than the maximum degree of reflection of the reflection coating for the illumination light.

A design of the illumination optical system has proven successful in practice. The first facet mirror may be a field facet mirror and the second facet mirror may be a pupil facet mirror. Precisely one field facet and precisely one pupil facet is then assigned to each object field illumination channel. Depending on the number of illumination tilt positions, the field facet may specify a plurality of object field illumination channels, which then impinge on different pupil facets.

In an aspect, specific second facets, as assignment candidates, are assigned to each of the first facets of the first facet mirror to specify object field illumination channels on the second facet mirror, namely those second facets, which are located within a conic section portion of the second facet mirror, which is limited by two conic section lines. Each of the conic section lines defines sites of the same reflection angle of the part bundle reflected on the first facet to specify the respective object field illumination channel. When the respectively observed first facet is tilted in such a way that it is assigned to one of the second candidate facets within the conic section portion, it is ensured that an angle of incidence of the part bundle during the reflection on the first facet is located between the two angles of incidence defined by the conic section lines, which limit the conic section portion. The conic section portions are selected in such a way that the conic section lines limiting them belong to angles of incidence, in which a predetermined degree of reflection results during the reflection on the observed first facet. One of the two conic section lines can define the maximum permissible angle of reflection and the other of the two conic section lines can define the minimum permissible reflection angle, between which a given degree of reflection R is achieved in the reflection of the part bundle at the observed first facet. The angles of incidence predetermined by the two conic section lines of the conic section portion at the observed first facet may differ by 30°, by 20°, by 10°, by 5° or by a still smaller angle amount. The illumination optical system may have a combination of features of the two above-mentioned aspects.

An assignment method can allow the second facet mirror to be occupied with pupil facets assigned to the field facets via object field illumination channels in such a way that the assignment leads to degrees of reflection of the facets that are independent of the illumination tilt position of the first facets within predetermined tolerance limits. The assignment may take place with the aid of conic section portions. As a result, an advantageous reduction is produced in the combinations of first and second facets to be checked in the assignment in the course of a reflectivity optimisation.

The advantages of an illumination system, a projection exposure system, a production method, and a microstructured or nanostructured component correspond to those which were already discussed above with reference to the illumination optical system according to the disclosure and the method according to the disclosure. Precisely adapted illuminations can be specified on the component or unit structure to be produced, so that, in particular, semiconductor chips with extremely fine and, in particular, complex structures can be produced.

BRIEF DESCRIPTION OF THE FIGURES

Embodiments of the disclosure will be described in more detail below with the aid of the drawings, in which.

DETAILED DESCRIPTION

Figure 1:
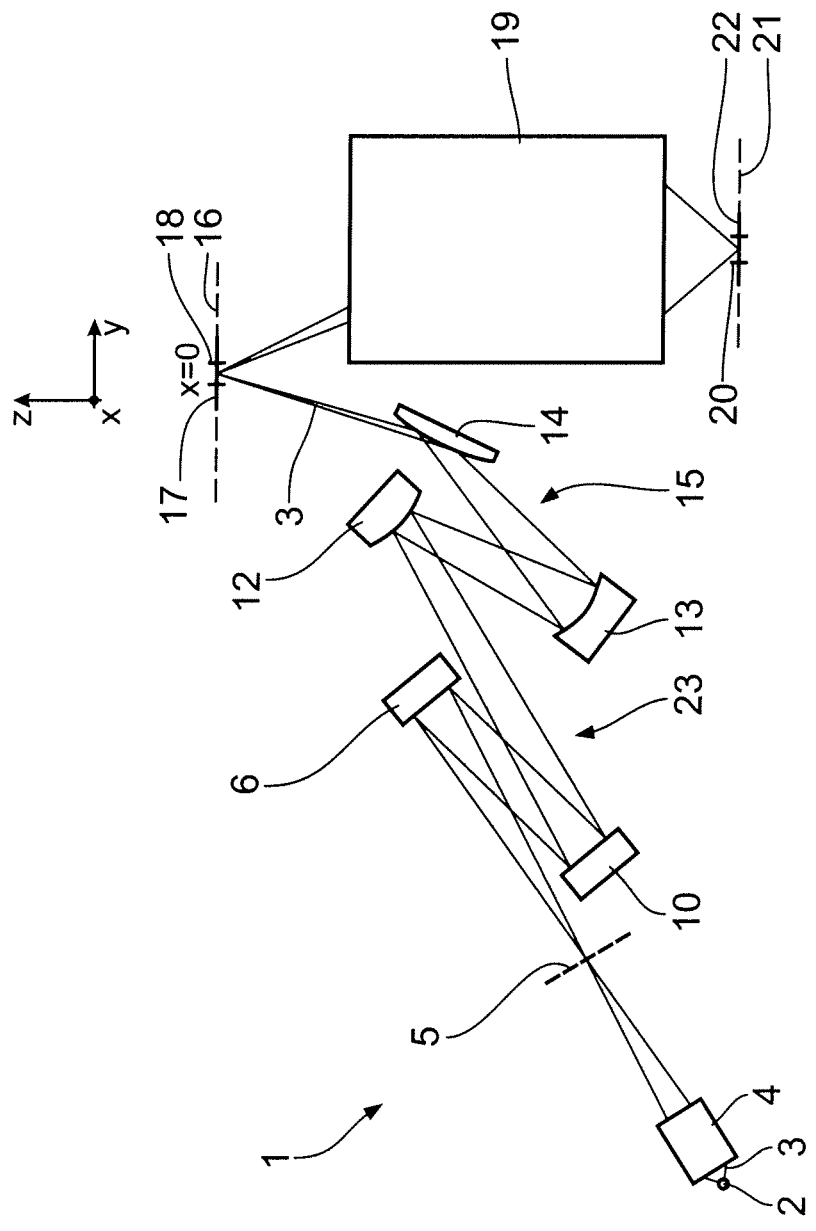
FIG. 1 shows schematically and in relation to an illumination optical system, in meridional section, a projection exposure system for microlithography.

A projection exposure system 1 for microlithography is used to produce a microstructured or nanostructured electronic semiconductor structural element. A light source 2 emits EUV radiation used for illumination in the wavelength range, for example between 5 nm and 30 nm. The light source 2 may be a GDPP source (gas discharge produced plasma) or an LPP source (laser produced plasma). A radiation source, based on a synchrotron, can also be used for the light source 2. A person skilled in the art will, for example, find information on a light source of this type in U.S. Pat. No. 6,859,515 B2. EUV illumination light or illumination radiation 3 is used for illumination and imaging within the projection exposure system 1. The EUV illumination light 3, after the light source 2, firstly runs through a collector 4, which is, for example, a nested collector with a multishell structure known from the prior art or, alternatively, an ellipsoidally formed collector. A corresponding collector is known from EP 1 225 481 A. After the collector 4, the EUV illumination light 3 firstly runs through an intermediate focus plane 5, which can be used to separate the EUV illumination light 3 from undesired radiation or particle fractions. After running through the intermediate focus plane, the EUV illumination light 3 firstly impinges on a field facet mirror 6.

To facilitate the description of positional relationships, a Cartesian global xyz-coordinates system is firstly drawn in the drawing in each case. The x-axis in FIG. 1 runs perpendicular to the drawing plane and out of it. The y-axis in FIG. 1 runs to the right. The z-axis runs upwardly in FIG. 1.

To facilitate the description of positional relationships in individual optical components of the projection exposure system 1, a Cartesian local xyz- or xy-coordinates system is also used in each case in the following Figs. The respective local xy-coordinates, where nothing else is described, span a respective main arrangement plane of the optical component, for example a reflection plane. The x-axes of the global xyz-coordinates system and the local xyz- or xy-coordinates systems run parallel to one another. The respective y-axes of the local xyz- or xy-coordinates systems have an angle to the y-axis of the global xyz-coordinates system, which corresponds to a tilt angle of the respective optical component about the x-axis.

Figure 2:
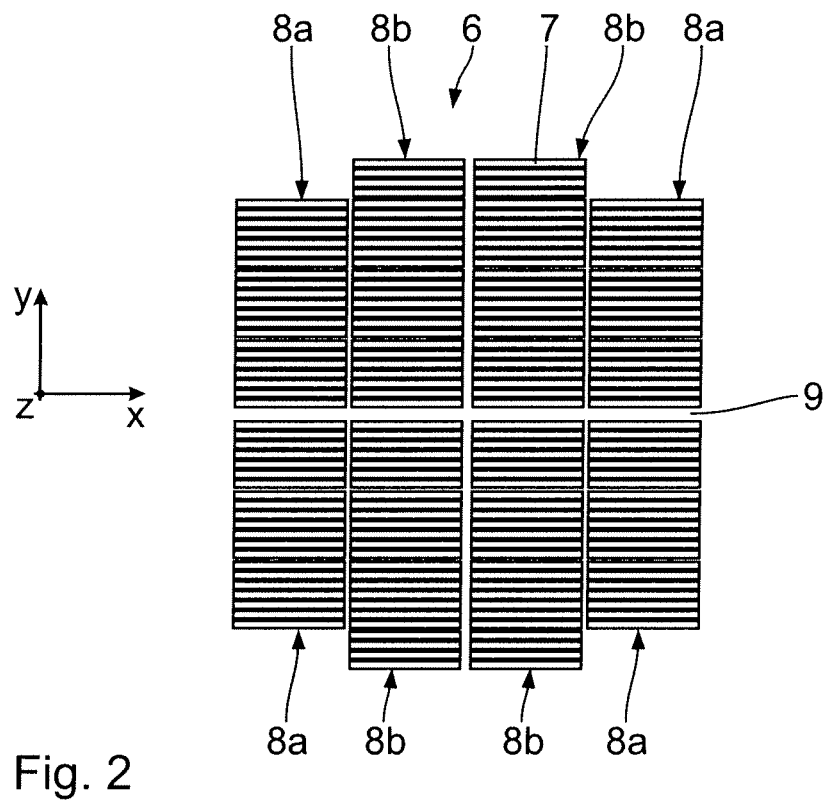
FIG. 2 shows a plan view of a facet arrangement of a field facet mirror of the illumination optical system of the projection exposure system according to FIG. 1.

FIG. 2 shows, by way of example, a facet arrangement of field facets 7 of the field facet mirror 6. The field facets 7 are rectangular and in each case have the same x/y-aspect ratio. The x/y-aspect ratio may, for example, be 12/5, 25/4 or 104/8.

The field facets 7 specify a reflection face of the field facet mirror 6 and are grouped in four columns each with six to eight field facet groups 8a, 8b. The field facet groups 8a in each case have seven field facets 7. The two additional edge-side field facet groups 8b of the two central field facet columns in each case have four field facets 7. Between the two central facet columns and between the third and fourth facet rows, the facet arrangement of the field facet mirror 6 has intermediate spaces 9, in which the field facet mirror 6 is shaded by holding spokes of the collector 4.

After reflection on the field facet mirror 6, the EUV illumination light 3 divided into beam pencils or part bundles, which are assigned to the individual field facets 7, impinges on a pupil facet mirror 10.

Figure 3:
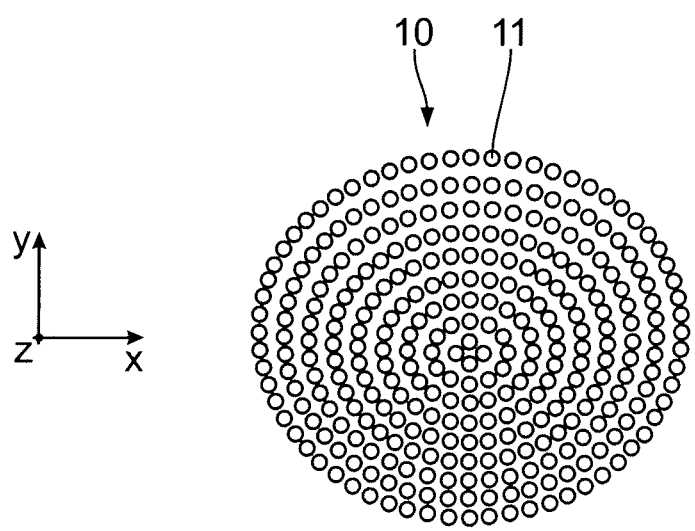
FIG. 3 shows a plan view of a facet arrangement of a pupil facet mirror of the illumination optical system of the projection exposure system according to FIG. 1.

FIG. 3 shows an exemplary facet arrangement of round pupil facets 11 of the pupil facet mirror 10. The pupil facets 11 are arranged around a centre in facet rings lying within one another. At least one pupil facet 11 is assigned to each part bundle of the EUV illumination light 3 reflected by one of the field facets 7 in such a way that, in each case, one facet pair that is impinged on with one of the field facets 7 and one of the pupil facets 11 specifies an object field illumination channel for the associated part bundle of the EUV illumination light 3. The channel-wise assignment of the pupil facets 11 to the field facets 7 takes place depending on a desired illumination by the projection exposure system 1.

The field facets 7 are imaged in an object plane 16 of the projection exposure system 1 via the pupil facet mirror 10 (cf FIG. 1) and a following transmission optical system 15 consisting of three EUV mirrors 12, 13, 14. The EUV mirror 14 is configured as a grazing incidence mirror. Arranged in the object plane 16 is a reticle 17, by which an illumination region in the form of an illumination field is illuminated with the EUV illumination light 3, the illumination field coinciding with an object field 18 of a downstream projection optical system 19 of the projection exposure system 1. The object field illumination channels are overlaid in the object field 18. The EUV illumination light 3 is reflected by the reticle 17.

The projection optical system 19 images the object field 18 in the object plane 16 in an image field 20 in an image plane 21. Arranged in this image plane 21 is a wafer 22, which carries a light-sensitive layer, which is exposed during the projection exposure with the projection exposure system 1. During the projection exposure, both the reticle 17 and the wafer 22 are scanned in a synchronised manner in the y-direction. The projection exposure system 1 is configured as a scanner. The scanning direction is also called the object displacement direction below.

The field facet mirror 6, the pupil facet mirror 10 and the mirrors 12 to 14 of the transmission optical system 15 are components of an illumination optical system 23 of the projection exposure system 1. Together with the projection optical system 19, the illumination optical system 23 forms an illumination system of the projection exposure system 1.

The field facet mirror 6 is a first facet mirror of the illumination optical system 23. The field facets 7 are first facets of the illumination optical system 23.

The pupil facet mirror 10 is a second facet mirror of the illumination optical system 23. The pupil facets 11 are second facets of the illumination optical system 23.

Figure 4:
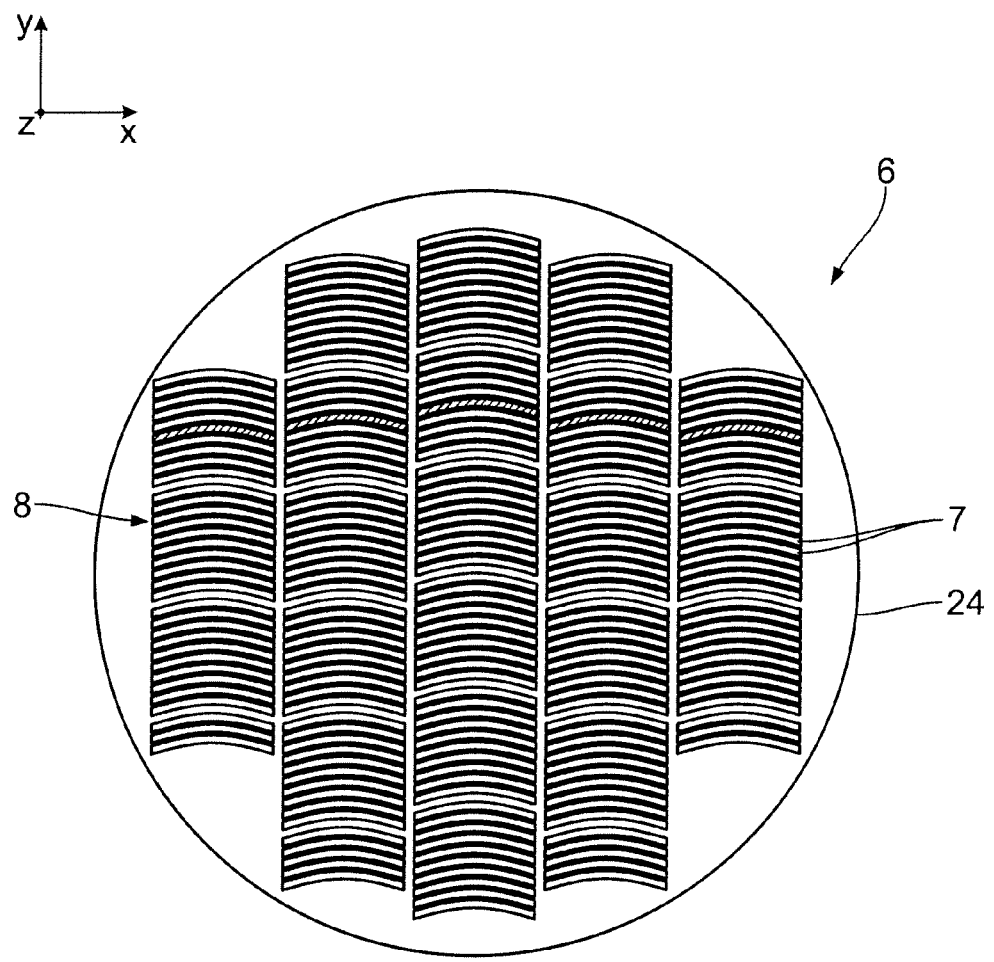
FIG. 4 shows, in a view similar to FIG. 2, a facet arrangement of a further configuration of a field facet mirror.

FIG. 4 shows a further configuration of a field facet mirror 6. Components which correspond to those which were described above with reference to the field facet mirror 6 according to FIG. 2, have the same reference numerals and will only be described inasmuch as they differ from the components of the field facet mirror 6 according to FIG. 2. The field facet mirror 6 according to FIG. 4 has a field facet arrangement with curved field facets 7. These field facets 7 are arranged in a total of five columns each with a plurality of field facet groups 8. The field facet arrangement is written into a circular limitation of a carrier plate 24 of the field facet mirror.

The field facets 7 of the embodiment according to FIG. 4 all have the same area and the same ratio of width in the x-direction and height in the y-direction, which corresponds to the x/y aspect ratio of the field facets 7 of the configuration according to FIG. 2.

Precisely two of the pupil facets 11 of the pupil facet mirror 10 are assigned to each of the field facets 7 of the respective configuration of the field facet mirror 6 by way of an object field illumination channel, in each case. The pupil facet mirror 10 thus has twice as many pupil facets 11 as the field facet mirror 6 has field facets 7.

Depending on the configuration of a mechanical tilting ability of the field facets 7, more than two of the pupil facets 11 of the pupil facet mirror 10 may be assigned to one of the field facets 7 by way of respective object field illumination channels. The field facets 7 can then be displaced into a corresponding number of illumination tilting positions.

Figure 5:
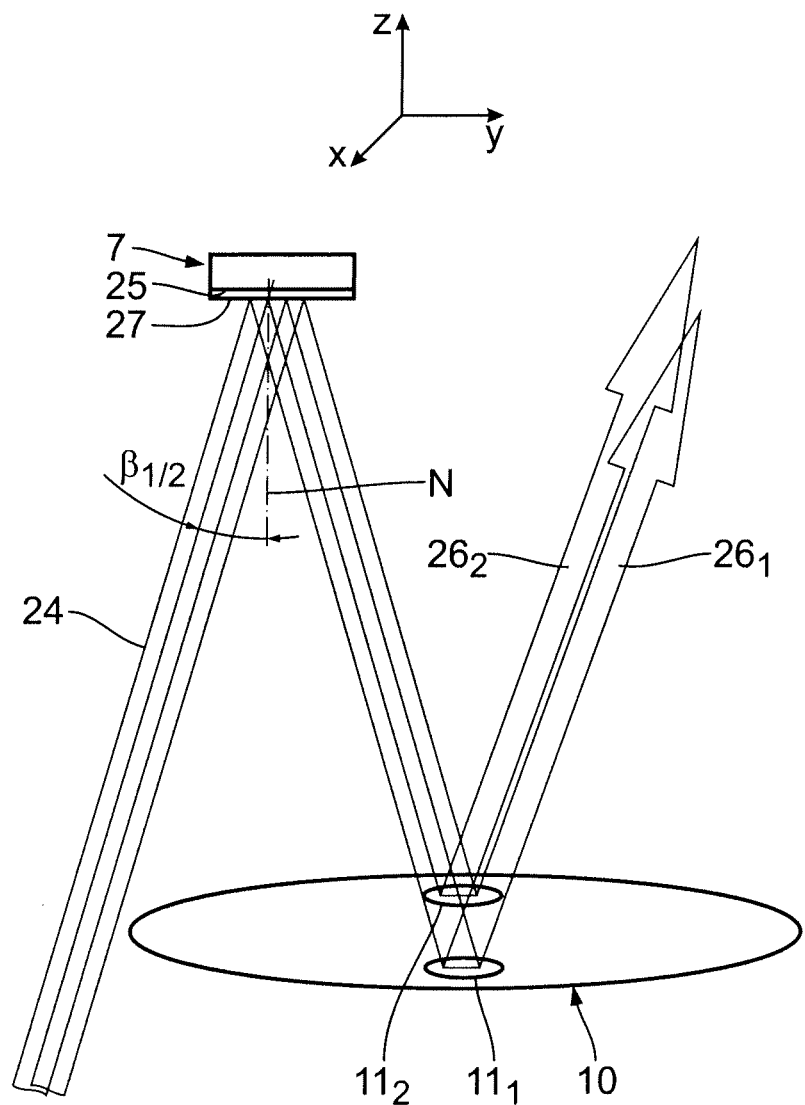
FIG. 5 schematically shows portions of two object field illumination channels, which are assigned to the two illumination tilt positions of a shown tiltable field facet of the field facet mirror according to FIG. 2 or 4, an incident illumination light part bundle in the two illumination tilt positions being reflected at an angle of incidence coinciding within a tolerance range of +/−10%.

FIG. 5 illustrates the reflected guidance of a part bundle 24 of a total bundle of the illumination light 3. A reflection face 25 of a field facet 7 shown by way of example is tiltable between a first illumination tilting position to guide the part bundle 24, which impinges on the reflection face 25, along a first object field illumination channel $26_1$ to the object field 18 or to the illumination field, and a further illumination tilt position to guide the part bundle 24 along a further object field illumination channel $26_2$ to the object field 18.

Along the first illumination channel $26_1$, the part bundle 24, after reflection on the field facet 7, is reflected on a first pupil facet $11_1$. The pupil facet $11_1$ is thus assigned to the field facet 7 by way of the object field illumination channel $26_1$. Along the object field illumination channel $26_2$, in other words in the other illumination tilt position of the field facet 7, the part bundle 24, after reflection on the field facet 7, is reflected on another pupil facet $11_2$ of the pupil facet mirror 10. Only the two pupil facets $11_1$ and $11_2$ of the pupil facet mirror 10 are shown in the schematic view according to FIG. 5. An angle of incidence $\beta_1$, with which the part bundle 24 is reflected on the reflection face 25 of the field facet mirror 7 in the first illumination tilt position assigned to the object field illumination channel $26_1$, coincides with an angle of incidence $\beta_2$, with which the part bundle 24 in the other illumination tilt position of the field facet mirror 7 is reflected on the reflection face 25, which is assigned to the object field illumination channel $26_2$. The angles of incidence $\beta_{1/2}$ are defined as the angles between the incident part bundle 24 and a normal N to the reflection face 25 of the field facet 7.

The reflection face 25 carries a multilayer coating, in other words a multilayer coating with an alternating sequence of molybdenum and silicon layers. A layer design of this multilayer reflection coating 27 is optimised to high reflectivity of the field facet 7 at the angle of incidence $\beta_{1/2}$. As the angle of incidence $\beta_{1/2}$, when switching over the field facet mirror 7 according to FIG. 5 between the two illumination tilt positions, which are assigned to the two object field illumination channels $26_1$, $26_2$, does not change, the field facet mirror 7, regardless of the illumination tilt position, has the same degree of reflection. The degrees of reflection of the field facet mirror 7 in the two illumination tilt positions, which are shown in FIG. 5, coincide within a tolerance range of +/−1%.

Instead of the multilayer reflection coating 27, a single layer or a double layer reflection coating with a very narrow angle of incidence tolerance range may also be used. For angles of incidence in the range close to 0°, in other words perpendicular incidence, and a periodic layer stack of the multilayer reflection coating 27, the angle of incidence tolerance range may be 7°. For angles of incidence in the range of 15°, the angle of incidence tolerance range may be in the range between 1° and 2°. When using multilayer reflection coatings with aperiodic layer stacks, in other words so-called broadband coatings, the angle of incidence tolerance range is increased. Broadband coatings of this type generally have a lower average reflectivity.

Figure 6:
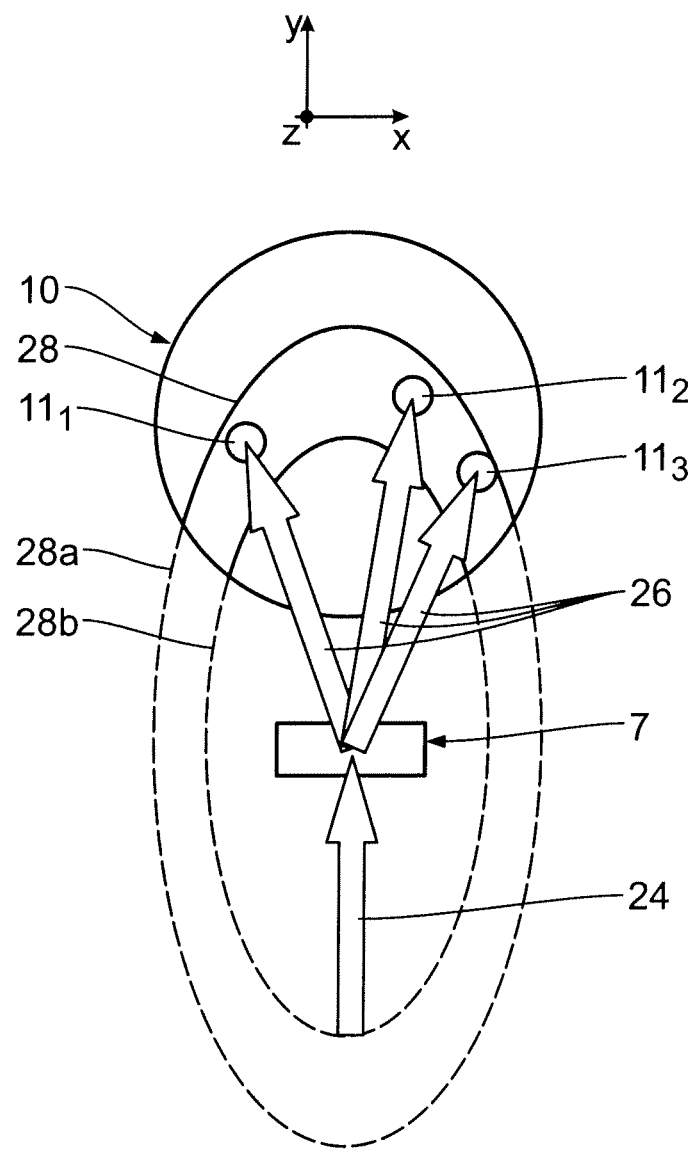
FIG. 6 schematically and not true to scale, shows a perpendicular projection view of a field facet of the field facet mirror according to FIG. 2 and of the pupil facet mirror according to FIG. 3, three pupil facets, which are assigned to illumination tilt positions of the field facet with the same angles of incidence of the incident illumination light part bundle, being shown emphasised.

In a perpendicular projection along the z-axis, FIG. 6 shows the arrangement according to FIG. 5. By way of example, three pupil facets $11_1$, $11_2$ and $11_3$ are shown, in the direction of which the part bundle 24 incident on the field facet 7 can be reflected at the same angle of incidence β. If the tilting mechanism of the field facet 7 allows adjustment in two illumination tilt positions, two of these three pupil facets $11_1$ to $11_3$ can be assigned to these two illumination tilt positions, for example. If the tilting mechanism of the field facet 7 allows, for example, the specifying of three illumination tilt positions, all three pupil facets $11_1$ to $11_3$ can be assigned to these illumination tilt positions, for example. Basically, by corresponding orientation of a tilt axis of the respective field facet 7 and the tilt mechanism of this field facet 7 within a predetermined tolerance range for the angle of incidence β, all the pupil facets 11 of the pupil facet mirror 10 can be activated by way of object field illumination channels 26 proceeding from the field facet 7 shown in FIG. 6, the illumination channels being located in a conic section portion 28 of the pupil facet mirror 10 indicated schematically in FIG. 6. The conic section portion 28 is limited by two conic section lines 28a, 28b and additionally limited by an outer contour of the pupil facet mirror 10. Outside this outer contour, the two conic section lines 28a, 28b are shown by dashed lines in FIG. 6. Depending on the geometric ratios, the conic section lines 28a, 28b may be parabolas, ellipses, circles or hyperbolas. Each of the two conic section lines 28a, 28b defines a corresponding tilt orientation in the field facet 7, so the part bundle 24 is reflected onto the respective conic section line 28a, 28b, sites of the same reflection angle of the part bundle 24 on the first facet 7 to specify the respective object field illumination channel 26. The pupil facets 11, which are located within the conic section portion 28, can be achieved by reflection of the part bundle 24 on the field facet 7 at an angle of incidence, which lies between the two limit angles defined by the conic section lines 28a, 28b. After specifying these limit angles, by determining the associated conic section lines 28a, 28b, in other words within the entire pupil facet mirror 10, the conic section portion 28 can be singled out, in which pupil facets 11 lie, which can be achieved by reflection of the part bundle 24 on the facet 7 at a reflection angle within these two limit angles. It is thus possible, using the conic section portion 28, to specify a pupil facet subgroup of all pupil facets 11 or to specify a quantity of pupil facet candidates for object field illumination channel assignment to the observed field facet 7.

Illumination tilt positions of the field facet 7 according to FIG. 6 can be assigned by the following method to at least two pupil facets 11: firstly, a first illumination tilt position of the pupil facet 7 is predetermined, at which one of the pupil facets 11, for example the pupil facet $11_1$ in FIG. 6, is impinged on by the part bundle 24 reflected by the field facet 7 by way of the assigned object field illumination channel. Within the conic section portion 28, which is predetermined by the angle of incidence tolerance range of the multilayer reflection coating 27 on the reflection face 25 of the field facet 7, a second illumination tilt position of the field facet 7 is then determined while retaining the angle of incidence of the part bundle 24 on the field facet 7 within the angle of incidence tolerance range. A further pupil facet, for example the pupil facet $11_2$ is now selected, which, in the determined second illumination tilt position is impinged on by the part bundle 24 reflected by the field facet 7 by way of the further object field illumination channel 26.

Figure 7:
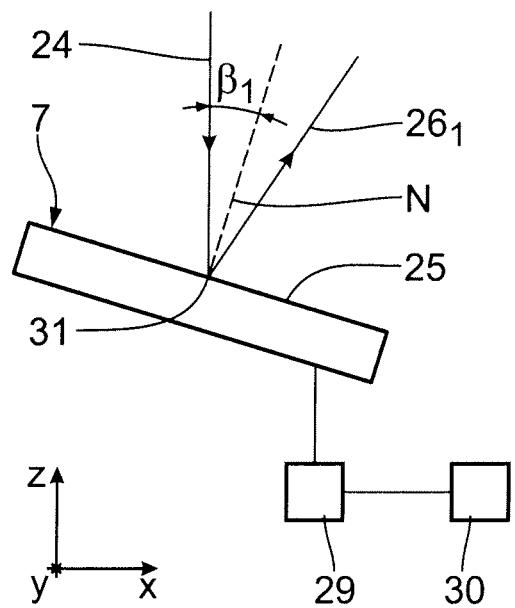
FIG. 7 shows a side view of the field facet according to FIG. 6 in a first illumination tilt position.
Figure 8:
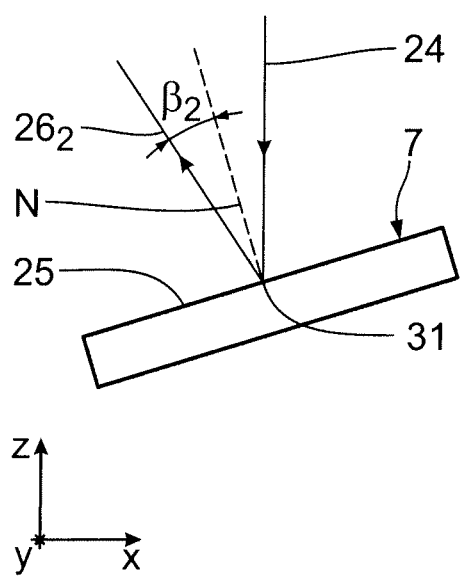
FIG. 8 shows a side view of the field facet according to FIG. 6 in a further illumination tilt position.

The coincidence of the angles of incidence $\beta_1$ and $\beta_2$ in the two illumination tilt positions of the field facet 7 is again made clear with the aid of FIGS. 7 and 8. The xyz-coordinate systems of FIGS. 7 and 8 relate to a main reflection face of the total field facet mirror 6.

FIG. 7 shows the field facet 7 in a first illumination tilt position, in which the incident part bundle 24 is reflected in the object field illumination channel $26_1$ at the angle of incidence $\beta_1$.

FIG. 8 shows the field facet 7 in a further illumination tilt position, in which the incident part bundle 24 is reflected by the field facet 7 in the object field illumination channel $26_2$ at the angle of incidence $\beta_2$. There applies: $\beta_1 = \beta_2$.

Between the two illumination tilt positions according to FIGS. 7 and 8, the field facet 7 is tilted by an actuator 29, which is only shown schematically in FIG. 7 and has a signal connection to the control device 30, by a tilt angle 2 $\beta_1$ about a tilt axis 31 extending parallel to the y-axis.

The incident part bundle 24 until the reflection on the field facet 7 does not change its position in the space in FIGS. 7 and 8.

The two object field illumination channels $26_1$ and $26_2$ according to FIGS. 7 and 8 pass into one another by reflection about a plane, which contains the incident part bundle 24 on the reflection face 25 and is perpendicular to the incidence plane of the part bundle 24 on the field facet 7, in other words by reflection about a plane parallel to the yz-plane. The two object illumination channels $26_1$, $26_2$ pass into one another by reflection along the part bundle 24 which is incident on the reflection face 25.

Figure 9:
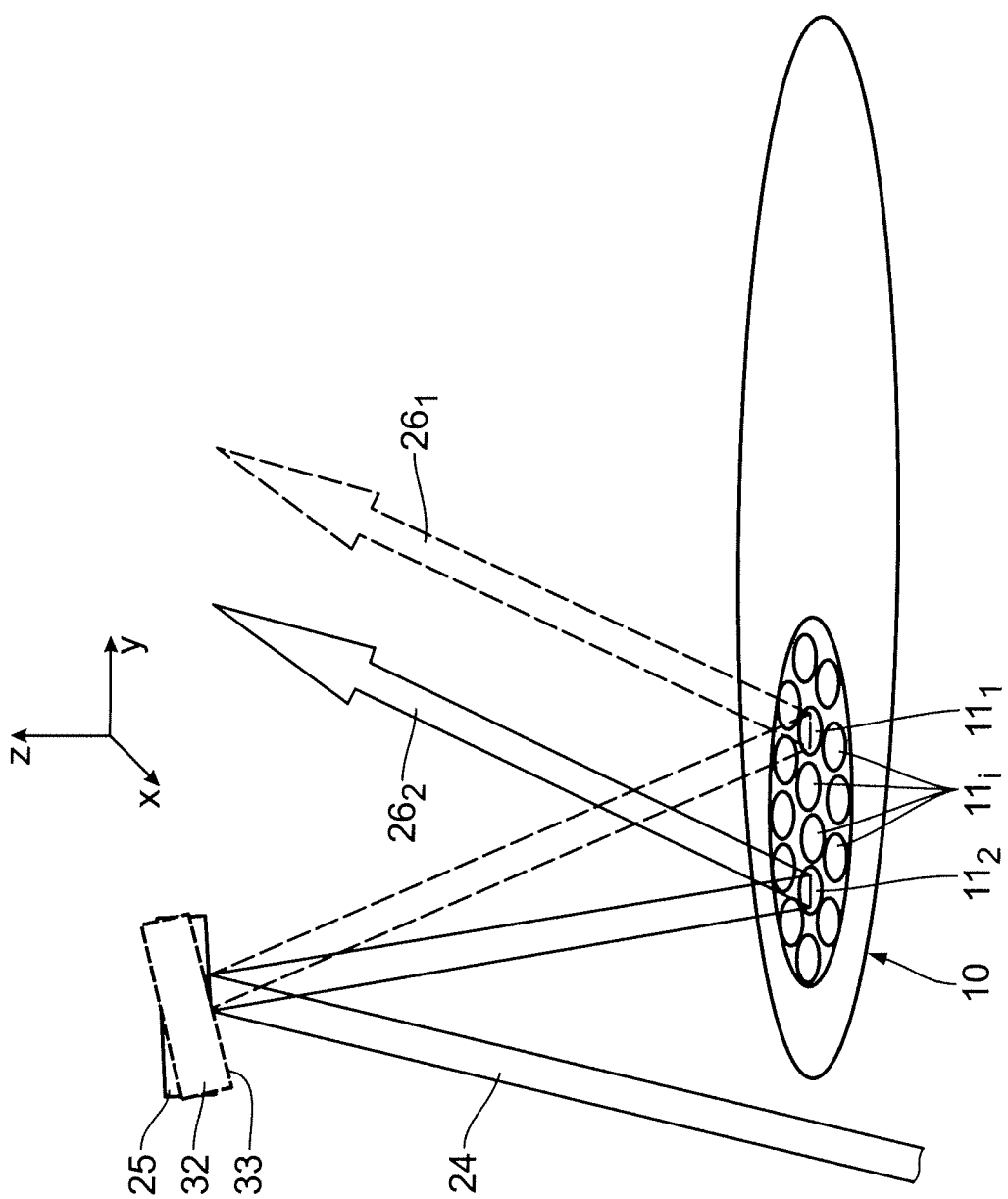
FIG. 9 shows, in a view similar to FIG. 5, two object field illumination channels, which are in turn assigned to various illumination tilt positions of the same field facet, the incident part bundle being reflected in the two illumination tilt positions with angles of incidence which differ by more than 10°.

FIG. 9 shows, in a view similar to FIG. 5, a further configuration of a field facet 32, which can be used instead of the field facet 7 according to FIGS. 5 to 8. Components or reference numerals, which have already been described above with reference to FIGS. 1 to 8, have the same reference numerals and will not be discussed again in detail.

FIG. 9 in turn shows the incident part bundle 24 and two object field illumination channels $26_1$ and $26_2$. A pupil facet $11_1$ is impinged upon by way of the object field illumination channel $26_1$, into which the incident part bundle 24 is directed in a first illumination tilt position shown by dashed lines in FIG. 9. A pupil facet $11_2$ is impinged upon by way of the further object field illumination channel $26_2$, into which the incident part bundle 24 is directed in a further illumination tilt position shown by a continuous line in FIG. 9. The angles of incidence of the part bundle 24 in the two illumination tilt positions shown in FIG. 9 differ absolutely by no more than 10% and differ in particular by no more than 10°.

A multilayer reflection coating 33 on the reflection face 25 of the field facet 32 has a layer design with a large angle of incidence tolerance range, thus reflects the incident part bundle 24 over a range of angles of incidence, which also include the angles of incidence of the object field illumination channels 26₁, 26₂, with a degree of reflection, which coincides within a tolerance range of +/−10%. A reflection coating of this type is also called a broadband reflection coating. The dependency of the degree of reflection R on the angle of incidence is shown by dashed lines as the degree of reflection curve 34 in FIG. 12. The degree of reflection R is defined here as the energy ratio $E_{out}/E_{in}$ between the energy $E_{out}$ of the part bundle 24 reflected by the field facet 7 and the energy $E_{in}$ of the part bundle 24 which is incident on the field facet 7. The reflectivity R within small tolerance range is constant about R=0.6 between a minimum angle of incidence $\beta_{min}$ in the range of about 9.5° and a maximum angle of incidence $\beta_{max}$ in the range from about 17.3°, and fluctuates within the range $[\beta_{min}, \beta_{max}]$ only between limit values R=0.58 and R=0.62.

A plurality of pupil facets 11₁, which can be achieved within the angle of incidence tolerance range $[\beta_{min}, \beta_{max}]$ by corresponding illumination tilt positions of the filed facet 32, are shown by way of example in FIG. 9. By way of example, depending on the mechanical design of the tilt adjustment of the field facet 32 according to FIG. 9, two or more pupil facets 11₁, 11₂ . . . , 11ₙ can be selected from the pupil facets 11ᵢ and are then impinged upon by way of object field illumination channels 26₁, 26₂ . . . 26ₙ. Because of the course of the degree of reflection curve 34, the energy of the part bundle 24 guided by way of the various object field illumination channels 26ᵢ is constant within a tolerance range of +/−10% regardless of the respective illumination tilt position of the field facet 32.

With the aid of FIGS. 10 and 11, a further configuration of a reflection coating on a field facet 35 will be described below, which can be used instead of the field facets 7 or 32. Components or reference variables, which have already been described above with reference to FIGS. 1 to 8, have the same reference numerals and will not be described again in detail.

A reflection face 36 of the field facet 35 is divided into two reflective portions 37, 38, the degrees of reflection R of which are optimised for one of two illumination tilt positions of the field facet 35, in each case. The first reflective portion 37 carries a first reflection coating, which is configured as a single layer, double layer or multi-layer coating and is optimised for a first angle of incidence $\beta_1$ for the incident part bundle 24. The second reflective portion 38 carries a further reflection coating, which in turn can be configured as a single layer, double layer or multi-layer coating and is maximised for a second angle of incidence $\beta_2$ of the incident part bundle 24 with regard to its degree of reflection. The degree of reflection R of the reflective portion 37 for the angle of incidence $\beta_1$ coincides here within a tolerance range of +/−10% with the degree of reflection R of the reflective portion 38 for the angle of incidence $\beta_2$. A coincidence of the degrees of reflection within a tolerance range of 5%, of 2%, of 1% or less than 1% is also possible by corresponding design of the reflection coatings of the reflective portions 37, 38.

Figure 10:
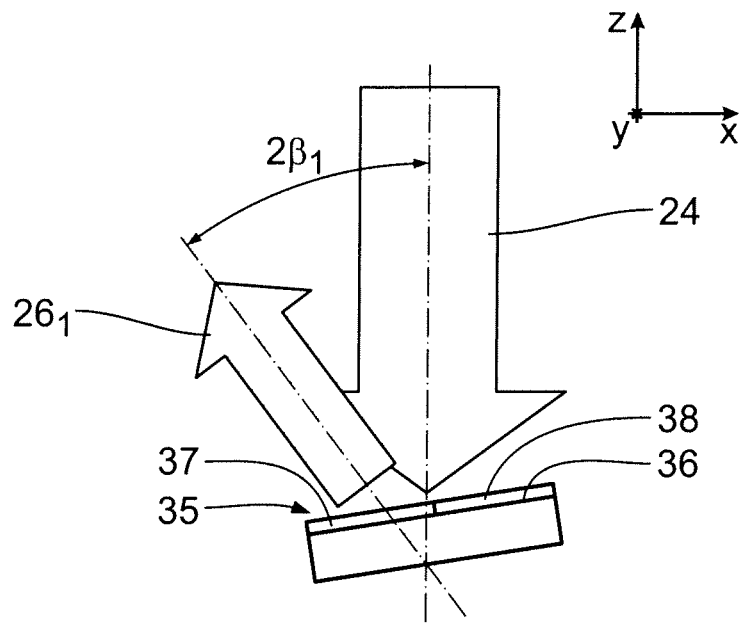
FIG. 10 shows, in a view similar to FIG. 7, a further configuration of a field facet in a first illumination tilt position in a side view.

FIG. 10 shows the field facet 35 in a first illumination tilt position, in which the incident part bundle 24 is deflected with the angle of incidence $\beta_1$ into a first object field illumination channel 26₁. Exclusively the reflection coating of the reflective portion 37 acts in this first illumination tilt position.

Figure 11:
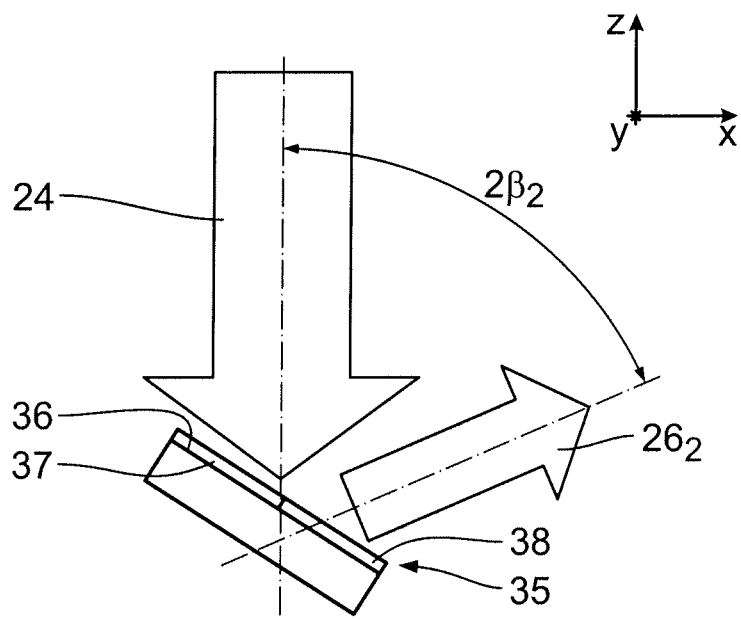
FIG. 11 shows the field facet according to FIG. 10 in a further illumination tilt position.

FIG. 11 shows the field facet 35 in a second illumination tilt position, in which the incident part bundle 24 is deflected at the angle of incidence $\beta_2$ into a further object field illumination channel 26₂. Exclusively the reflection coating of the reflective portion 38 acts in this further illumination tilt position.

Because of the coinciding degrees of reflection R, the part bundle 24 reflected into the illumination channels 26₁, 26₂, after reflection on the field facet 35, has the same energy, regardless of the respective illumination tilt position.

Figure 12:
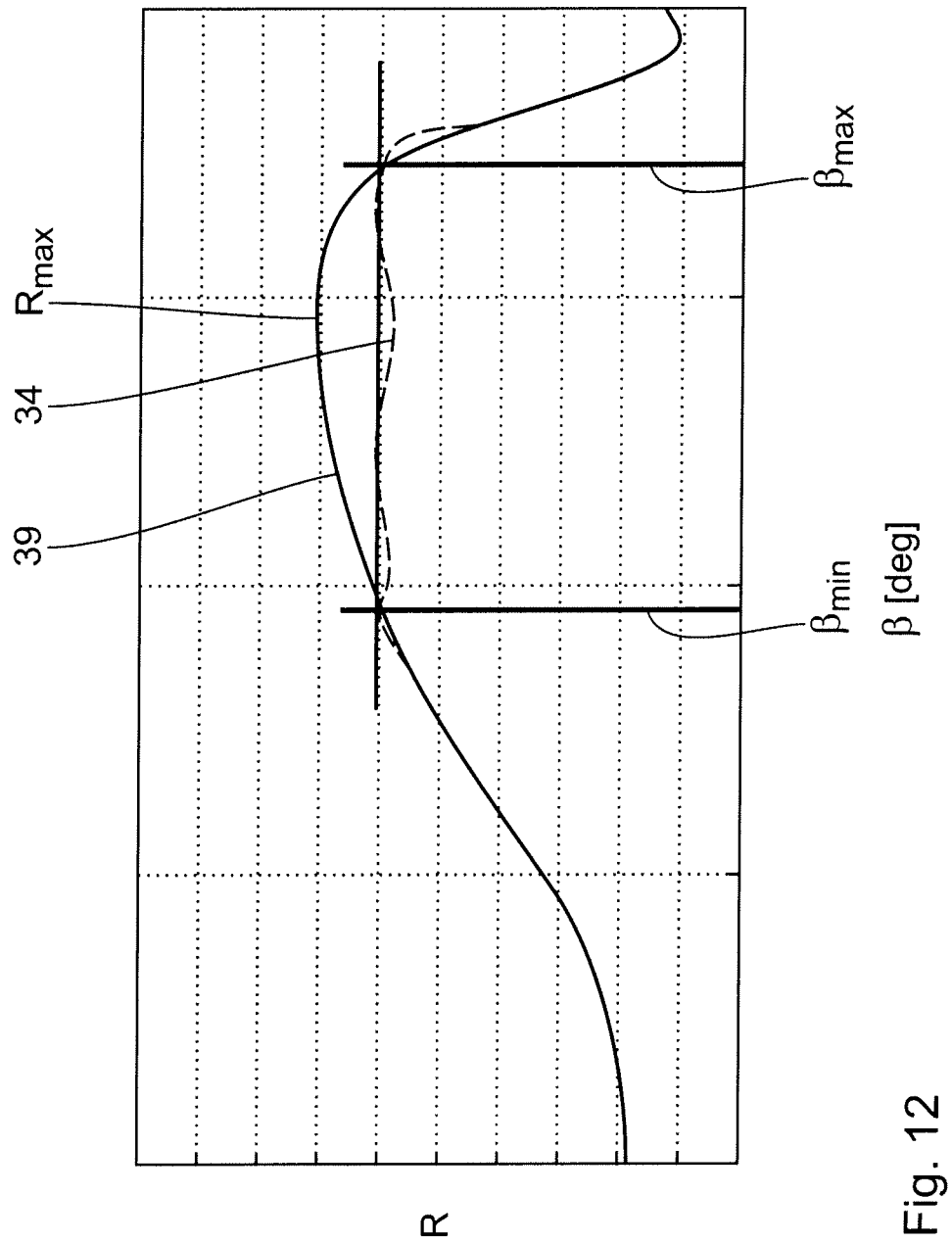
FIG. 12 shows, in a graph, the dependency of a degree of reflection of a layer design on a reflection face of one of the field facets on an angle of incidence, dependencies being shown for two different layer designs by continuous and dashed lines.

A further design of a reflection coating, which is used instead of the reflection coating 33 of the field facet 32 according to FIG. 9, is described below with the aid of a degree of reflection curve 39 shown by a continuous line in FIG. 12.

The degree of reflection curve 39 does not run substantially constantly along the angle of incidence range $[\beta_{min}, \beta_{max}]$ by a specific value of the degree of reflection, but has a course there of the degree of reflection curve 39 with a maximum $R_{max}$ of the degree of reflection lying between the two angles of incidence $\beta_{min}$, $\beta_{max}$, wherein there applies: $R_{max} \approx 0.71$. In the two limit angles of incidence $\beta_{min}$ and $\beta_{max}$, the reflection coating with the degree of reflection curve 39 in each case also has the same degree of reflection R of 0.6. As long as the field facet, for example the field facet 32 according to FIG. 9, is operated with illumination tilt positions, which correspond to angles of incidence for the incident part bundle 24, which, within a tolerance range, in each case correspond to the angles of incidence $\beta_{min}$ or $\beta_{max}$, the part bundle 24 reflected by the field facet 32 by these illumination tilt positions, regardless of the selected illumination tilt position, in turn has the same energy.

With the aid of FIGS. 13 and 14, a further configuration of an illumination optical system 40 will be described below, which can be used instead of the components 10 to 14 of the illumination optical system 23 according to FIG. 1 in the projection exposure system 1. Components or reference variables which have already been described above with reference to FIGS. 1 to 12, have the same reference numerals and will not be described again in detail.

A pupil facet mirror 41, in the illumination optical system 40, has a through-opening 42 for the illumination light 3. After passing through the through-opening 42, the illumination light 3 is firstly reflected on the field facets 7 of the field facet mirror 6 and then on the pupil facets, not shown in detail, of the pupil facet mirror 41 and directed from there to the object field 18 where the various object field illumination channels 26 overlap. Two object field illumination channels 26 defining the edge of the bundle of illumination light 3 and two object field illumination channels 26₁ and 26₂ assigned to the two illumination tilt positions of a schematically shown facet 7 are shown in FIG. 13. This field facet 7 is in turn impinged upon in FIG. 13 by a part bundle 24 of the illumination light 3. The two angles of incidence $\beta_1$ and $\beta_2$ of the part bundle 24 assigned to the object field illumination channels 26₁, 26₂ are the same within a tolerance range of +/−10%. Because of the virtually symmetrical structure of the illumination optical system 40 for the beam path of the illumination light 3 in the region of the field facet mirror 6 and of the pupil facet mirror 41, a higher degree of coincidence of the angles of incidence $\beta_1$, $\beta_2$ can also be achieved for the illumination tilt positions of the field facets 7 of the field facet mirror 6, for example a coincidence within a tolerance range of +−5%, of +−2%, of +−1% or an even better coincidence.

Figure 13:
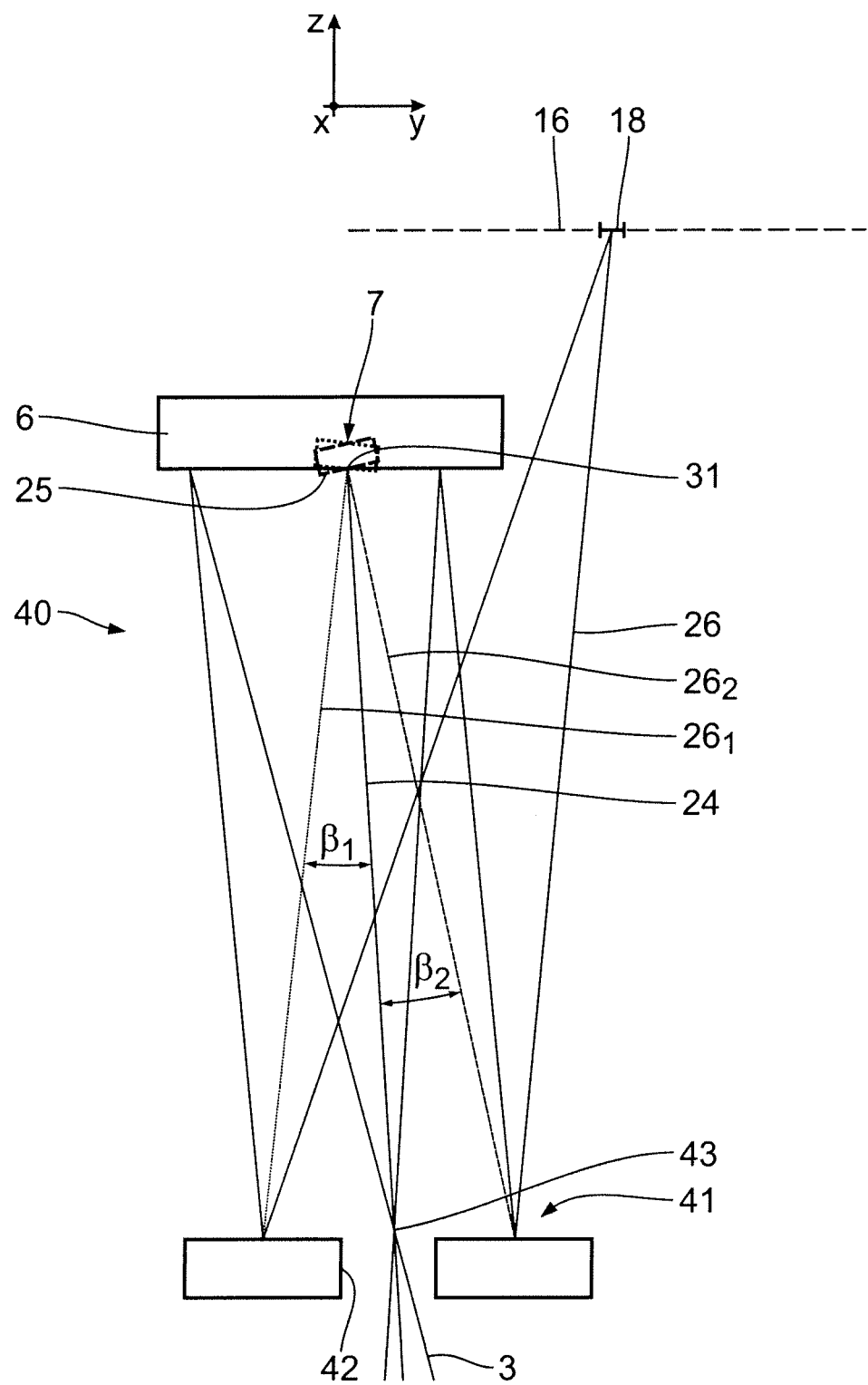
FIG. 13 shows, detail-wise, in a view similar to FIG. 1, the guidance of an illumination light bundle in an alternative configuration of a field facet mirror and a pupil facet mirror of a variant of the illumination optical system, which can be used as a alternative to the illumination optical system according to FIG. 1 in the projection exposure system.

Between the two illumination tilt positions, the field facet 7 according to FIG. 13 is tilted about an x-axis parallel tilt axis 31 about by an angle of 12°.

The total bundle of the illumination light 3 has a numerical aperture of 0.125 in the region of an intermediate focus 43 close to the throughput through the through-opening 42 of the field facet mirror 41. The illumination light illuminates the object field 18 by way of all the object field illumination channels 26 with a numerical aperture of 0.125.

Figure 14:
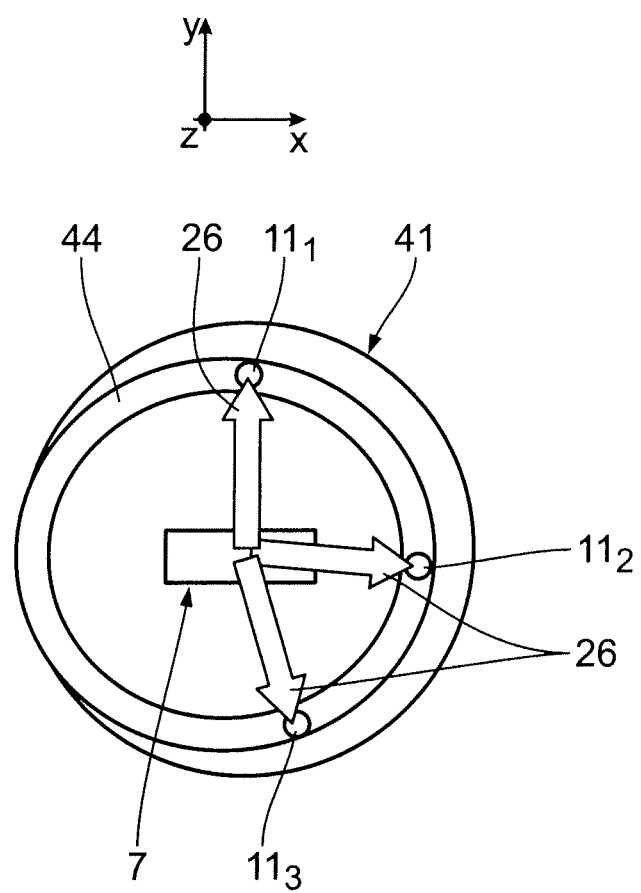
FIG. 14 shows, in a view similar to FIG. 6, pupil facets accessible at the same angles of incidence by way of object field illumination channels of one and the same field facet in the configuration of the illumination optical system according to FIG. 13.

FIG. 14 shows, in a view similar to FIG. 6, the pupil facets 11 of the pupil facet mirror 41, which can be impinged upon by one and the same field facet 7 with the same angle of incidence β within a predetermined tolerance range for the incident part bundle 24. These pupil facets 11 lie within a ring 44, which represents a special case of a conic section. Three selected pupil facets $11_1$, $11_2$, $11_3$, which lie within the ring 44, are shown in FIG. 14. That which was already stated above in conjunction with the corresponding assignment for the field facet 7 according to FIG. 6 applies to the assignment of these pupil facets $11_1$ to $11_3$ to illumination tilt positions of the field facets 7 according to FIG. 14.

The conic section portion 28 may, even region-wise, have the shape of an ellipse, a parabola, a hyperbola or a ring.

During the projection exposure, the reticle 17 and the wafer 22, which carries a light-sensitive coating for the EUV illumination light 3, are provided. At least one portion of the reticle 17 is then projected on the wafer 22 with the aid of the projection exposure system 1. Finally, the light-sensitive layer exposed with the EUV illumination light 3 is developed on the wafer 22. The microstructured or nanostructured component, for example a semiconductor chip, is produced in this manner.

The embodiments described above were described with the aid of an EUV illumination. As an alternative to an EUV illumination, a UV or a VUV illumination can also be used, for example with illumination light with a wavelength of 193 nm.

What is claimed is:

1. An illumination optical system, comprising:
   a first facet mirror comprising a plurality of first facets including a group of first facets, each of the first facets having a first reflection face; and
   a second facet mirror comprising a plurality of second facets, each of the second facets having a second reflection face,
   wherein:
      for each of the first facets of the group of first facets:
         when the first facet is in a first position, the first reflection face of the first facet guides a part bundle of illumination light along a first channel to a corresponding second reflection face;
         when the first facet is in a second position, the first reflection face of the first facet guides the part bundle of illumination light along a second channel to a corresponding second reflection face which is different from the second reflection face to which the first reflection face guides the part bundle of illumination light when the first reflection face is in its first position;
         when the first facet is in its first position, the first reflection face reflects the part bundle of illumination light with a first reflectivity;
         when the first facet is in its second position, the first reflection face reflects the part bundle of illumination light with a second reflectivity;
         the second reflectivity coincides with the first reflectivity within a tolerance range of +/−10%;
         the corresponding second reflection faces of the first and second channels are located on a conic section portion of the second facet mirror;
         the conic section portion is limited by a first conic section line and a second conic section line;
         the first conic section line is defined by a first angle of incidence of the part bundle illumination light onto the first facet;
         the second conic section line is defined by a second angle of incidence of the part bundle illumination light onto the first facet; and
         absolute values of the first angle of incidence and the second angle of incidence differ by at most 10°; and
      the illumination optical system is configured to be used for projection lithography.

2. The illumination optical system according to claim 1, wherein:
   when each first facet of the group of first facets is in its first position, the part bundle has a third angle of incidence with the first reflection face of the first facet relative to the normal of the first reflection face of the first facet;
   when each first facet of the group of first facets is in its second position, the part bundle has a fourth angle of incidence with the first reflection face of the first facet relative to the normal of the first reflection face of the first facet; and
   absolute value of the fourth angle of incidence coincides with the third angle of incidence within a tolerance range of +/−10%.

3. The illumination optical system according to claim 1, wherein each first reflective face includes a first portion and a second portion, the first portion of each first reflective face is optimised for the first reflectivity, and the second portion of each first reflective face is optimised for the second reflectivity.

4. The illumination optical system according to claim 1, wherein at least one first reflection face comprises a reflection coating.

5. The illumination optical system according to claim 4, wherein the reflection coating is a broadband reflection coating.

6. The illumination optical system according to claim 4, wherein each of the first and second reflectivities is smaller by more than 1% than a maximum reflectivity of the reflection coating for the illumination light.

7. The illumination optical system according to claim 1, wherein the illumination optical system is configured so that an object field of a following imaging optical system can be arranged in the illumination field of the illumination optical system.

8. A projection exposure system, comprising:
   an illumination optical system according to claim 1; and
   a projection optical system configured to image the object field of the illumination optical system into an image field of the projection optical system,
   wherein the projection exposure system is a projection exposure system for microlithography.

9. The projection exposure system of claim 8, further comprising an EUV light source.

10. A method, comprising:
    providing a system, comprising:
       an illumination optical system according to claim 1; and
       a projection optical system configured to image the object field of the illumination optical system into an image field of the projection optical system; and
    using the system to project at least a part of a reticle onto a region of a layer of a wafer with the aid of the projection exposure system.

11. The method of claim 10, further comprising:
    for each of the first facets of the group of first facets:
       determining the first conic section line;
       determining the second conic section line; and determining the location of the corresponding second reflection face of the second channel within the conic section portion.

12. The illumination optical system of claim 1, wherein for each of the first facets of the group of first facets:
when the first facet is in the its first position, the first reflection face of the first facet is tilted at a first angle; and
when the first facet is in the its second position, the first reflection face of the first facet is tilted at a second angle.

13. The illumination optical system of claim 1, wherein the group of first facets comprise each of the first facets on which the illumination light impinges during use of the illumination system.

14. A method, comprising:
providing the illumination optical system according to claim 1, wherein:
the illumination optical system is configured so that an object field of a following imaging optical system can be arranged in the illumination field of the illumination optical system; and
for each of the first facets of the group of first facets:
when the first facet is in its first position, the first reflection face is tilted at a first angle; and
when the first facet is in its second position, the first reflection face is tilted at a second angle;
the second angle has a same absolute value as the first angle to within 10°;
selecting the first and second angles so that they have the same absolute value within 10°.

15. The illumination optical system according to claim 1, for at least one first facet of the group of first facets:
the first and second channels are mirror symmetric to each other with respect to a plane;
the plane contains part bundle of illumination light incident onto the at least one first facet;
the plane is perpendicular to an incidence plane of the part bundle of illumination light incident onto the at least one first facet.

16. An illumination optical system, comprising:
a first facet mirror comprising a plurality of first facets including a group of first facets, each of the first facets having a first reflection face; and
a second facet mirror comprising a plurality of second facets, each of the second facets having a second reflection face,
wherein:
for each of the first facets of the group of first facets:
when the first facet is in a first position, the first reflection face of the first facet guides a part bundle of illumination light along a first channel to a corresponding second reflection face;
when the first facet is in a second position, the first reflection face of the first facet guides the part bundle of illumination light along a second channel to a corresponding second reflection face which is different from the second reflection face to which the first reflection face guides the part bundle of illumination light when the first reflection face is in its first position;
when the first facet is in its first position, the part bundle of illumination light has a first angle of incidence with respect to a normal of the first reflection face;
when the first facet is in the its second position, the part bundle of illumination light has a second angle of incidence with respect to a normal the first reflection face;
absolute values of the first angle of incidence and the second angle of incidence differ by no more than 10°;
the corresponding second reflection faces of the first and second channels are located on a conic section portion of the second facet mirror;
the conic section portion is limited by a first conic section line and a second conic section line;
the first conic section line is defined by a third angle of incidence of the part bundle illumination light onto the first facet;
the second conic section line is defined by a fourth angle of incidence of the part bundle illumination light onto the first facet; and
absolute values of the third angle of incidence and the fourth angle of incidence differ by at most 10°.

17. The illumination optical system according to claim 16, wherein at least one first reflection face comprises a reflection coating.

18. The illumination optical system according to claim 17, wherein the reflection coating is a broadband reflection coating.

19. A projection exposure system, comprising:
an illumination optical system according to claim 16; and
a projection optical system configured to image the object field of the illumination optical system into an image field of the projection optical system,
wherein the projection exposure system is a projection exposure system for microlithography.

20. The projection exposure system of claim 19, further comprising an EUV light source.

21. A method, comprising:
providing a system, comprising:
an illumination optical system according to claim 16; and
a projection optical system configured to image the object field of the illumination optical system into an image field of the projection optical system; and
using the system to project at least a part of a reticle onto a region of a layer of a wafer with the aid of the projection exposure system.

22. The method of claim 21, further comprising:
for each of the first facets of the group of first facets:
determining the first conic section line;
determining the second conic section line; and
determining the location of the corresponding second reflection face of the second channel within the conic section portion.

23. The illumination optical system of claim 16, wherein for each of the first facets of the group of first facets:
when the first facet is in the its first position, the first reflection face of the first facet is tilted at a first angle; and
when the first facet is in the its second position, the first reflection face of the first facet is tilted at a second angle.

24. The illumination optical system of claim 16, wherein the group of first facets comprise each of the first facets on which the illumination light impinges during use of the illumination system.

25. The illumination optical system according to claim 16, for at least one first facet of the group of first facets:
the first and second channels are mirror symmetric to each other with respect to a plane;

the plane contains part bundle of illumination light incident onto the at least one first facet;

the plane is perpendicular to an incidence plane of the part bundle of illumination light incident onto the at least one first facet.

* * * * *

UNITED STATES PATENT AND TRADEMARK OFFICE
CERTIFICATE OF CORRECTION

PATENT NO. : 8,817,233 B2
APPLICATION NO. : 13/040765
DATED : August 26, 2014
INVENTOR(S) : Hans-Juergen Mann It is certified that error appears in the above-identified patent and that said Letters Patent is hereby corrected as shown below:

In the Specification
In Col. 8, Line 35, delete "$\beta_1.=\beta_2.$" and insert -- $\beta_1=\beta_2.$ --.
In Col. 9, Line 13, after "incidence" insert -- $\beta$ --.
In Col. 9, Line 23, delete "11$_1$," and insert -- 11$_i$, --.

In the Claims
In Col. 14, Line 3, delete "normal the" and insert -- normal of the --.

Signed and Sealed this
Eighteenth Day of November, 2014

Michelle K. Lee
*Deputy Director of the United States Patent and Trademark Office*